(12) United States Patent
Reddy et al.

(10) Patent No.: US 6,339,835 B1
(45) Date of Patent: Jan. 15, 2002

(54) PSEUDO-ANDING IN DYNAMIC LOGIC CIRCUITS

(75) Inventors: Lakshmi Narasimha Reddy, Valhalla, NY (US); Thomas Edward Rosser, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/329,455

(22) Filed: Jun. 10, 1999

(51) Int. Cl.[7] .............................................. G06F 17/50
(52) U.S. Cl. ............................. 716/1; 716/16; 716/17
(58) Field of Search ............................. 326/93, 95, 98; 716/1, 16, 17

(56) References Cited

U.S. PATENT DOCUMENTS

| | | | |
|---|---|---|---|
| 5,003,487 A | 3/1991 | Drumm et al. | 716/6 |
| 5,113,352 A | 5/1992 | Finnerty | 716/7 |
| 5,208,759 A | 5/1993 | Wong | 716/9 |
| 5,222,031 A | 6/1993 | Kaida | 716/9 |
| 5,237,514 A | 8/1993 | Curtin | 716/6 |
| 5,251,147 A | 10/1993 | Finnerty | 716/6 |
| 5,349,536 A | 9/1994 | Ashtaputre et al. | 716/9 |
| 5,396,435 A | 3/1995 | Ginetti | 716/6 |
| 5,397,749 A | 3/1995 | Igarashi | 716/8 |
| 5,461,576 A | 10/1995 | Tsay et al. | 716/6 |
| 5,526,276 A | 6/1996 | Cox et al. | 716/17 |
| 5,544,071 A | 8/1996 | Keren et al. | 716/6 |
| 5,550,748 A | 8/1996 | Xiong | 716/13 |
| 5,555,188 A | 9/1996 | Chakradhar | 716/6 |
| 5,815,687 A * | 9/1998 | Masleid et al. | 326/95 |
| 6,025,741 A * | 2/2000 | Ciraula et al. | 326/93 |
| 6,097,207 A * | 8/2000 | Berstein et al. | 326/95 |

OTHER PUBLICATIONS

IBM Corp.; Technical Disclosure Bulletin—Partitioning Logic on to Graph Structures; vol. 32, No. 9A, Feb. 1990; 7 pages.

IBM Corp.; Technical Disclosure Bulletin—Logic Optimization and Mapping to Arbitrary N–Input Functions Under Constraints; vol. 33, No. 5, Oct. 1990; 4 pages.

IBM Corp.; Technical Disclosure Bulletin—Techniques for Improving Multi–Partitioning Algorithm; vol. 36, No. 1, Jan. 1993; 5 pages.

IBM Corp.; Technical Disclosure Bulletin—Algorithm for Incremental Timing Analysis; vol. 38, No. 01, Jan. 1995; 8 pages.

* cited by examiner

Primary Examiner—Trong Phan
(74) Attorney, Agent, or Firm—Kelly K. Kordzik; Winstead Sechrest & Minick P.C.; Anthony V. S. England (57) ABSTRACT

A typical domino logic circuit has a foot device, which is the n-type evaluate transistor coupled between the n-type logic circuitry receiving the data inputs and the ground potential. This AND function provides an opportunity to move full domino AND blocks fed by full domino books of any type to the clock input of the source book. This makes the source book act like a pseudo-clocked book with a reset that must propagate from the AND block moved to its clock input. If the AND block were on the critical path, a complete stage of logic can be removed.

28 Claims, 10 Drawing Sheets

PSEUDO-ANDING IN DYNAMIC LOGIC CIRCUITS

TECHNICAL FIELD

This invention relates generally to digital logic, and more specifically, to a network of logic gates, such as dynamic logic gates incorporating foot devices.

BACKGROUND INFORMATION

Figure 1:
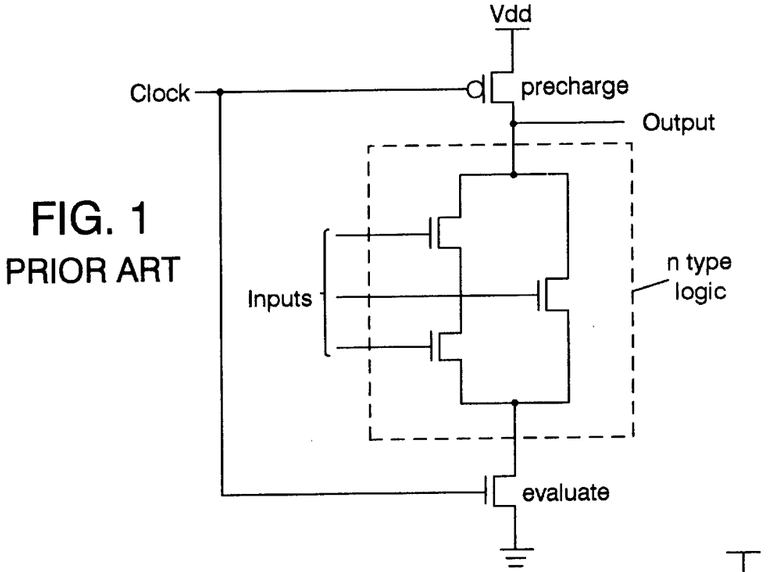
FIG. 1 illustrates a basic dynamic gate.

The use of dynamic logic is an efficient way of increasing circuit speed and reducing (lie area of integrated circuitry. Many dynamic circuit schemes have been described which share common basic features. The basic dynamic gate, shown in FIG. 1, includes a logic structure whose output node is precharged to VDD by a p-type transistor (the"precharge" transistor) and conditionally discharged to ground by an n-type transistor (the"evaluate" transistor). The precharge and evaluate transistors are typically connected to a single phase clock. During the precharge phase, the clock is low and the output node is precharged to VDD. At the completion of the precharge phase, the clock goes high and the path to VDD is turned off while the path to ground is conditionally turned on. In this evaluate phase, depending on the state of the data inputs, the output will either be at a high level or will be pulled down.

Figure 2:
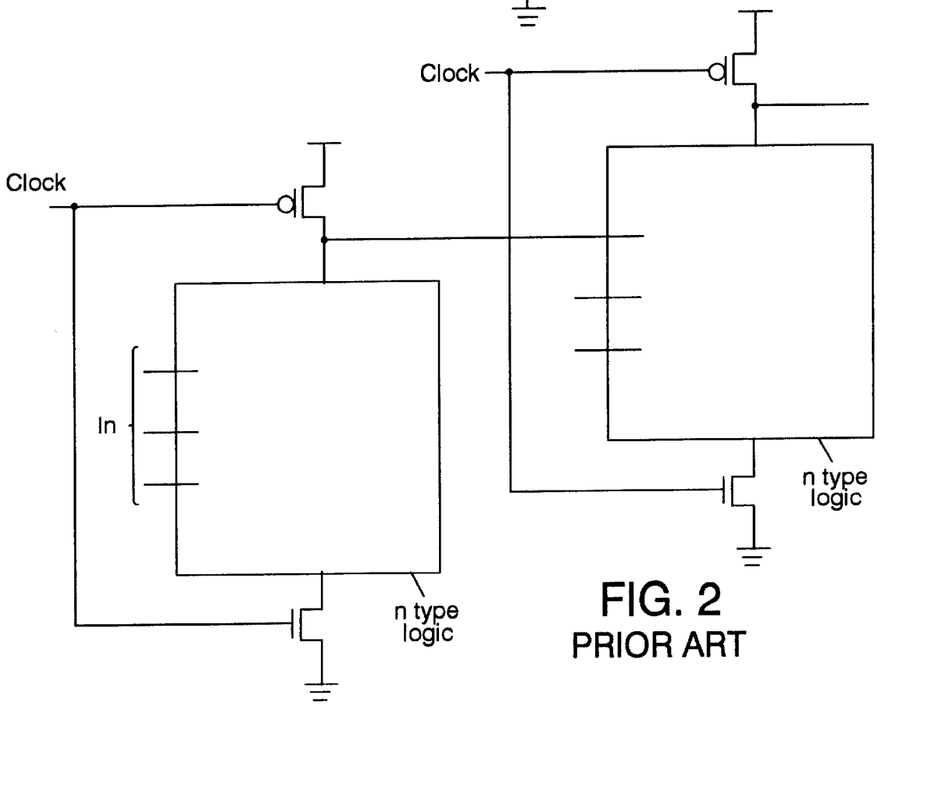
FIG. 2 illustrates two such basic dynamic gates connected in cascade.

This dynamic logic is advantageous in that it generally requires less transistors than static logic. Note, there is often an inverter employed at the output in order to cascade such dynamic logic circuits, as shown in FIG. 2.

However, when many of these circuits are cascaded, delays in propagating the signal through the cascaded blocks can mount. Therefore, there is a need in the art for faster dynamic logic circuitry.

SUMMARY OF THE INVENTION

A typical domino logic circuit has a foot device, which is the n-type evaluate transistor coupled between the n-type logic circuitry receiving the data inputs and the ground potential. This sequential arrangement implements protection from accidental discharge of the precharge node (which would result in an invalid evaluation). Proper evaluation occurs when the data is 1 and the clock is 1. This AND function provides an opportunity to move full domino AND blocks fed by full domino books of any type to the clock input of the source book. This makes the source book act like a pseudo-clocked book with a reset that must propagate from the AND block moved to its clock input. If the AND block were on the critical path, a complete stage of logic can be removed.

By employing pseudo-ANDing, improvements in speed can be realized with various circuit configurations.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The use of pseudo-ANDing is constrained by the time it takes for resets of the precharged nodes to propagate through the network. These resets are initiated by the clock turning off. In a footed device, this will break the path to ground at the foot device and will enable the PFET to precharge the internal node to a logic 1. When pseudo-clocking is used, the function of the clock at the pseudo-clocked book is replaced by data. When the data is a 0, the block will precharge. If the previous book supplying the data is footed, then the data will reset from a 1 to a 0 after some delay, and then the pseudo-clocked book will begin to reset. This propagation of reset must occur within the allotted time, or pseudo-clocking, and therefore pseudo-ANDing, cannot be allowed at this point.

Refer now to the drawings wherein depicted elements are not necessarily shown to scale and wherein like or similar elements are designated by the same reference numeral through the several views.

Figure 3:
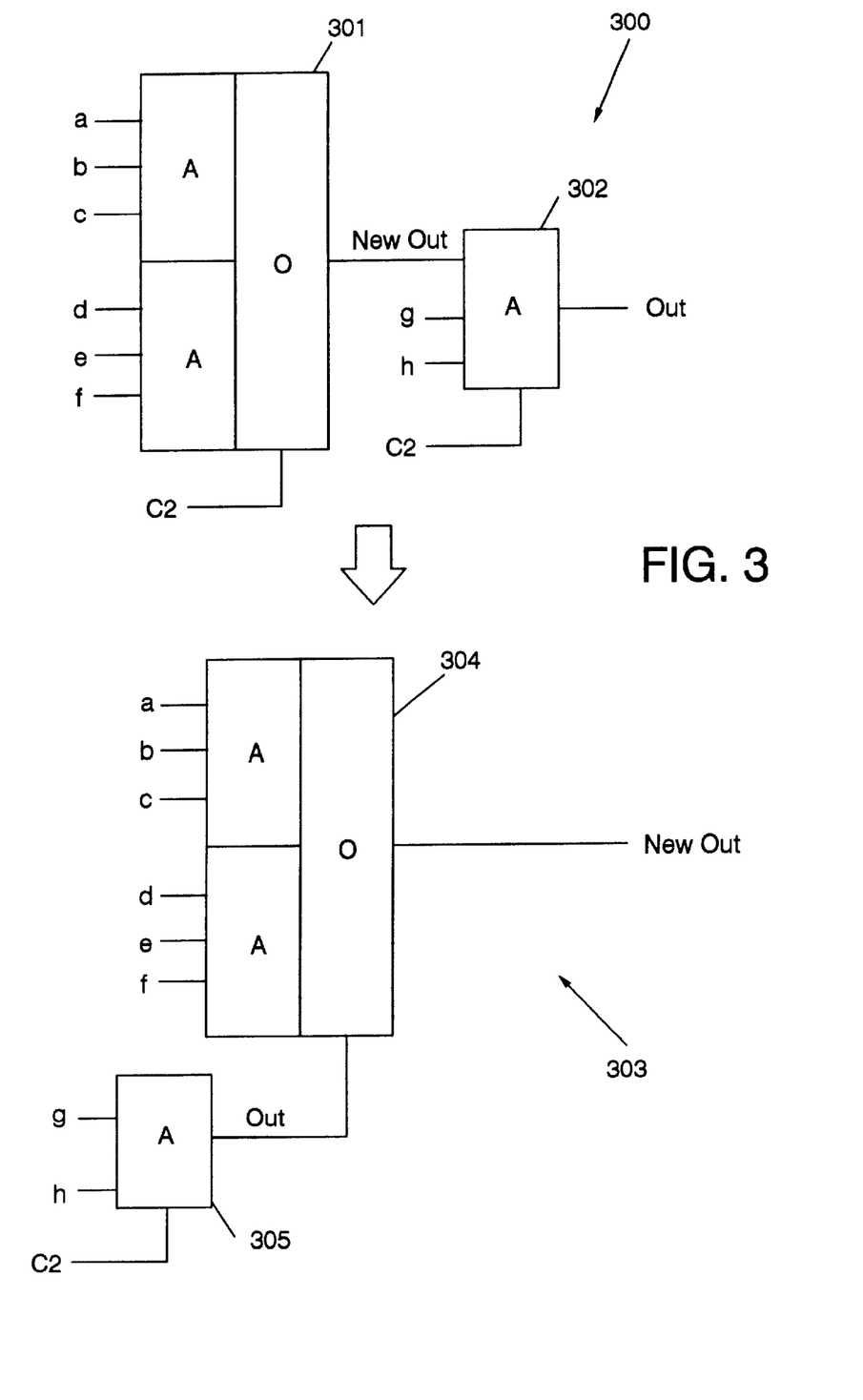
FIGS. 3–8 and 10–13 illustrate various alternative embodiments of the present invention.

FIG. 3 illustrates a first embodiment of the present invention whereby logic circuit 300 is redesigned into pseudo-ANDed circuit 303. Block 301 may represent an AO (AND-OR) or some other functionality for performing a logic operation on data inputs a, b, c, d, e, and f. Nevertheless, the basic structure of block 301 is represented by the circuit similar to that illustrated in FIG. 1 where an n-type logic tree performs a logic operation on the data inputs a–f, and a foot device receives clock signal c2. The output of circuit 301, NewOut is received by AND device 302, which performs an AND operation on data inputs NewOut, g and h. AND device 302 also has a foot device receiving clock signal c2.

Redesigned pseudo-ANDed logic circuit 303, which performs the same operation as circuit 300, is able to operate more quickly. This improvement in speed is due to a decrease in the number of transistors through which the logic value must travel. For example, in circuit 300, the precharge node internal to circuit 302 must drain to ground through four NFET transistors (one for each of the three logical inputs and one more for the foot device). In the restructured circuit 303, that same precharge node now has one fewer NFET through which it must drain, improving the speed with which that can occur. A larger speed-up is seen by the paths from logical inputs a through f as they had all four NFET transistors of circuit 302 removed from their path to Out. Logic block 304, which performs the same logic operation as logic block 301, also receives data inputs a–f.

However, the foot device, which in logic block 301 received clock signal c2, now receives the output from AND device 305, which performs an AND operation on inputs g and h, and has its foot device coupled to clock signal c2.

Figure 4:
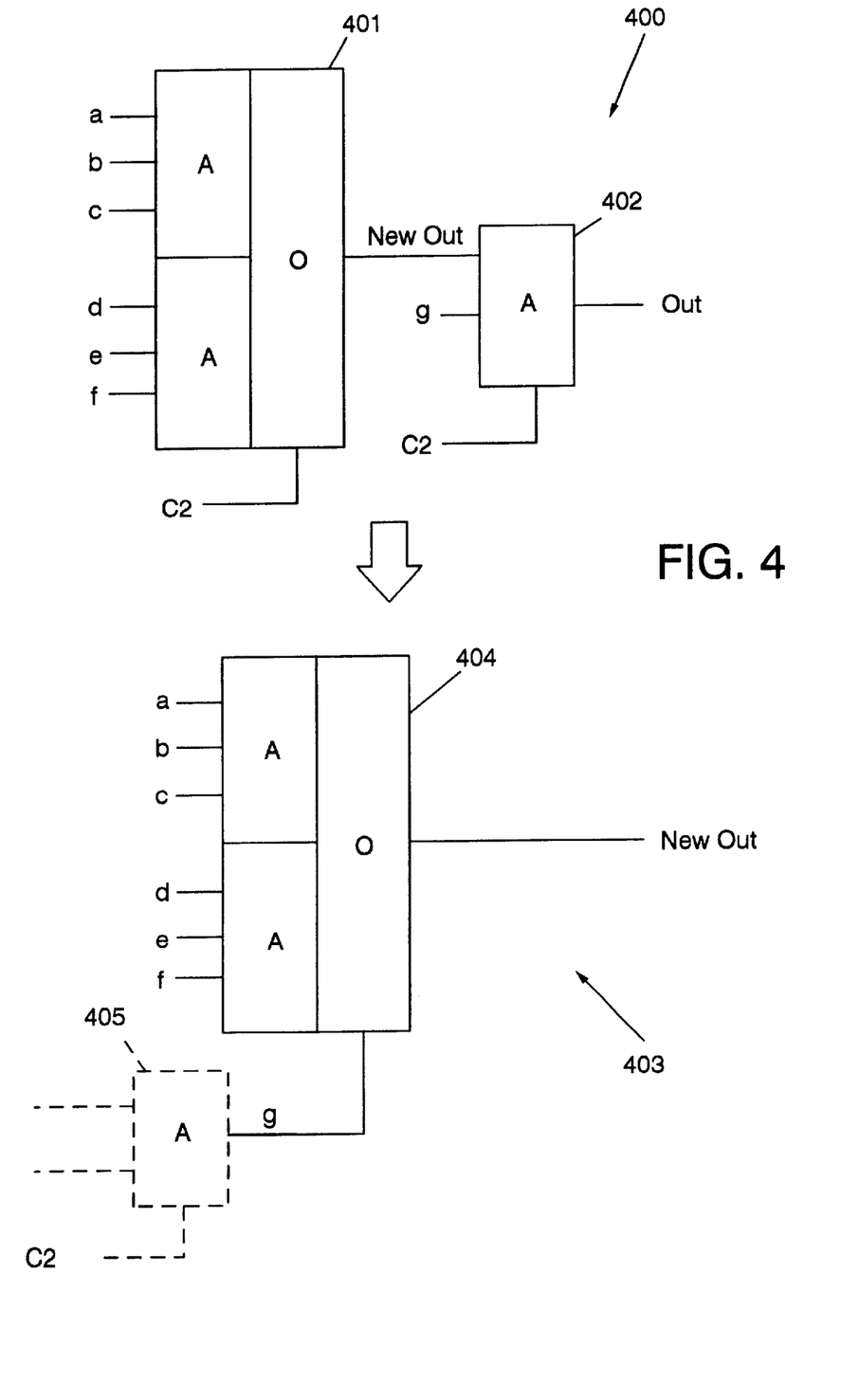

FIG. 4 illustrates another alternative embodiment of the present invention whereby logic circuit 400 is redesigned into logic circuit 403. Logic block 401 receives data inputs a–f, and has a foot device receiving clock signal c2. The output of logic block 401, NewOut, is received at one of the data inputs of AND circuit 402, which performs an AND operation on NewOut and data input g. The foot device of AND circuit 402 also receives clock signal c2.

The redesigned circuit 403 includes logic block 404, which is identical to logic block 401, except that the foot device now receives data input g, instead of clock signal c2. Since data input g will arrive from a previous domino logic circuit 405, which may be of any other configuration, it will be clocked by a received clock signal c2 at the foot device of circuit 405. FIG. 4 illustrates a special case of the conversion illustrated in FIG. 3 where AND device 402 has only two data inputs, which are both footed. The redesigned circuit 403 eliminates AND block 402, resulting in an improvement in the speed of operation.

Figure 5:
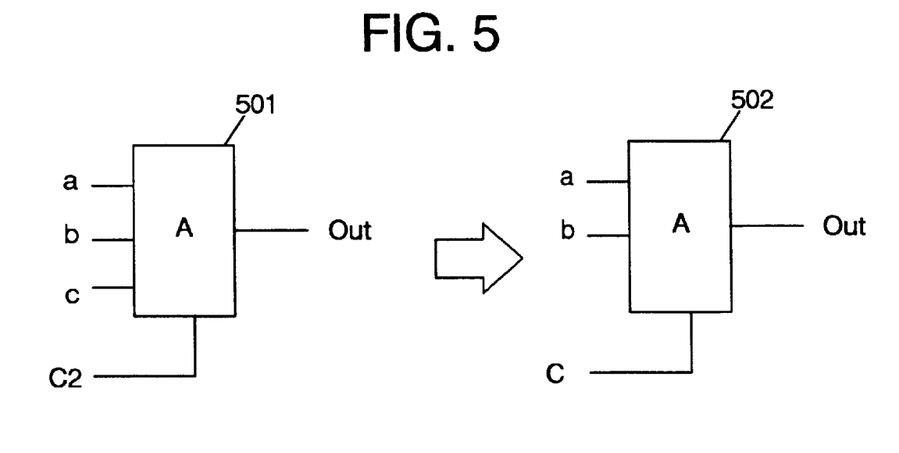

FIG. 5 illustrates a situation where a footed AND circuit 501 can be made faster by moving its earliest arriving data input (in this case, data input c) to the clock input on the foot device. The earliest arriving signal is selected since the delay from the foot device to the output (NewOut) is somewhat slower than the delays for the other NFETs in the tree that are above it. The earliest arriving input has the most time to spare for this slightly "extra" delay. This reduces a 3-input footed AND to be a 2-input pseudo-clocked AND circuit 502, which can operate 20% faster than circuit 501.

Circuit 502 is created from circuit 501 by moving data input c to be received by the foot device in circuit 502.

Figure 6:
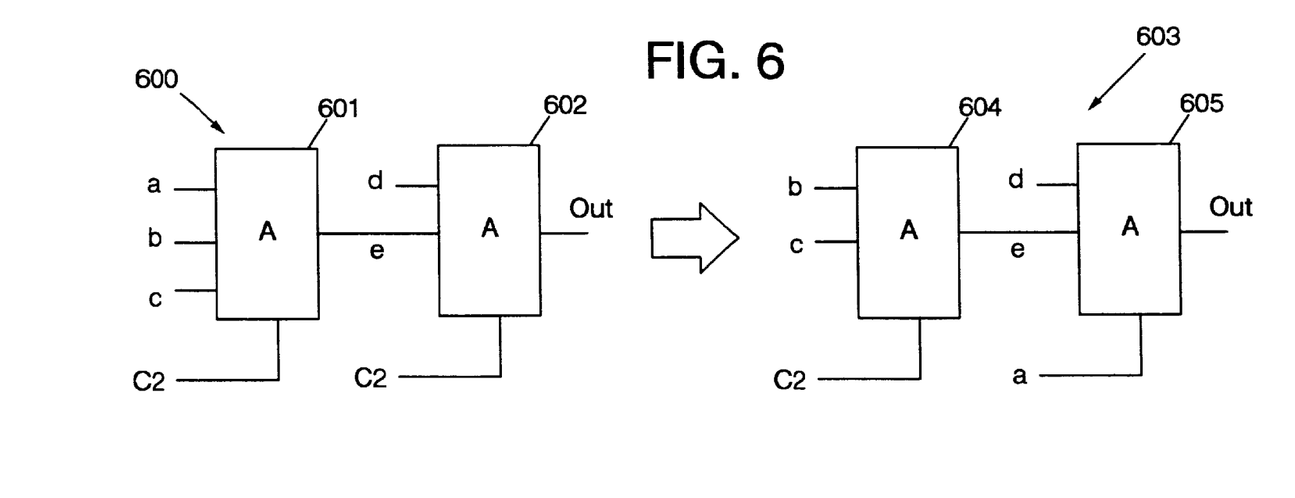

FIG. 6 illustrates another alternative embodiment of the present invention whereby an AND device feeding only a footed AND device can move the latest arriving signal to the clock input of the receiving AND device.

Logic circuit 600 has AND device 601 receiving data inputs a, b, and c, along with a foot device receiving clock signal c2. AND device 602 receives data inputs d and e, with a foot device receiving clock signal c2. Data signal e is the output of AND device 601. Circuit 600 is converted into circuit 603. AND device 604 receives data inputs b and c, which its foot device receiving clock signal c2. The output of AND device 604 (data input e) is ANDed by AND device 605 with data input d. The foot device of AND device 605 receives data input a, the latest arriving signal into logic device 604.

Figure 7:
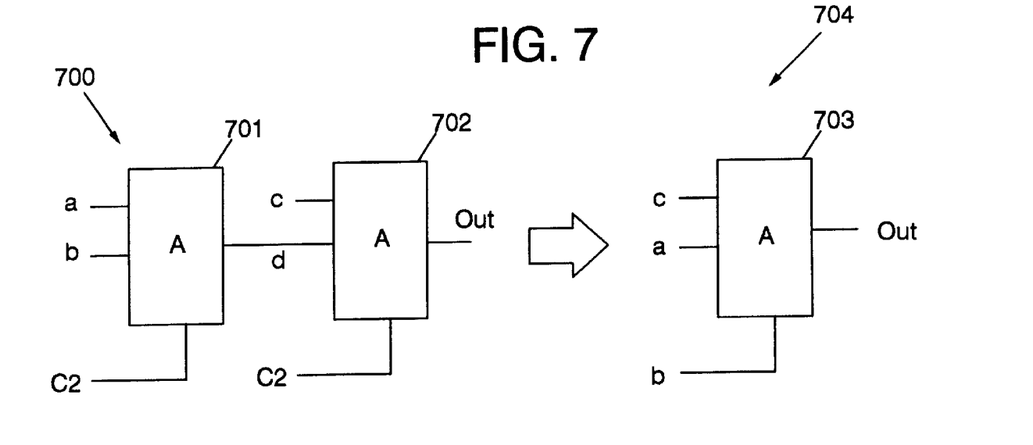

FIG. 7 illustrates 2-input AND device 701 of circuit 700 feeding footed AND device 702. Circuit 700 can be converted into circuit 704, comprising AND device 703.

AND device 701 receives data inputs a and b, and clock signal c2 at its foot device. AND device 702 receives data input c and the output, d, of AND device 701, with its foot device receiving clock signal c2.

Circuit 704 comprises AND device 703 receiving data inputs a and c, with its foot device receiving data input b.

Figure 10:
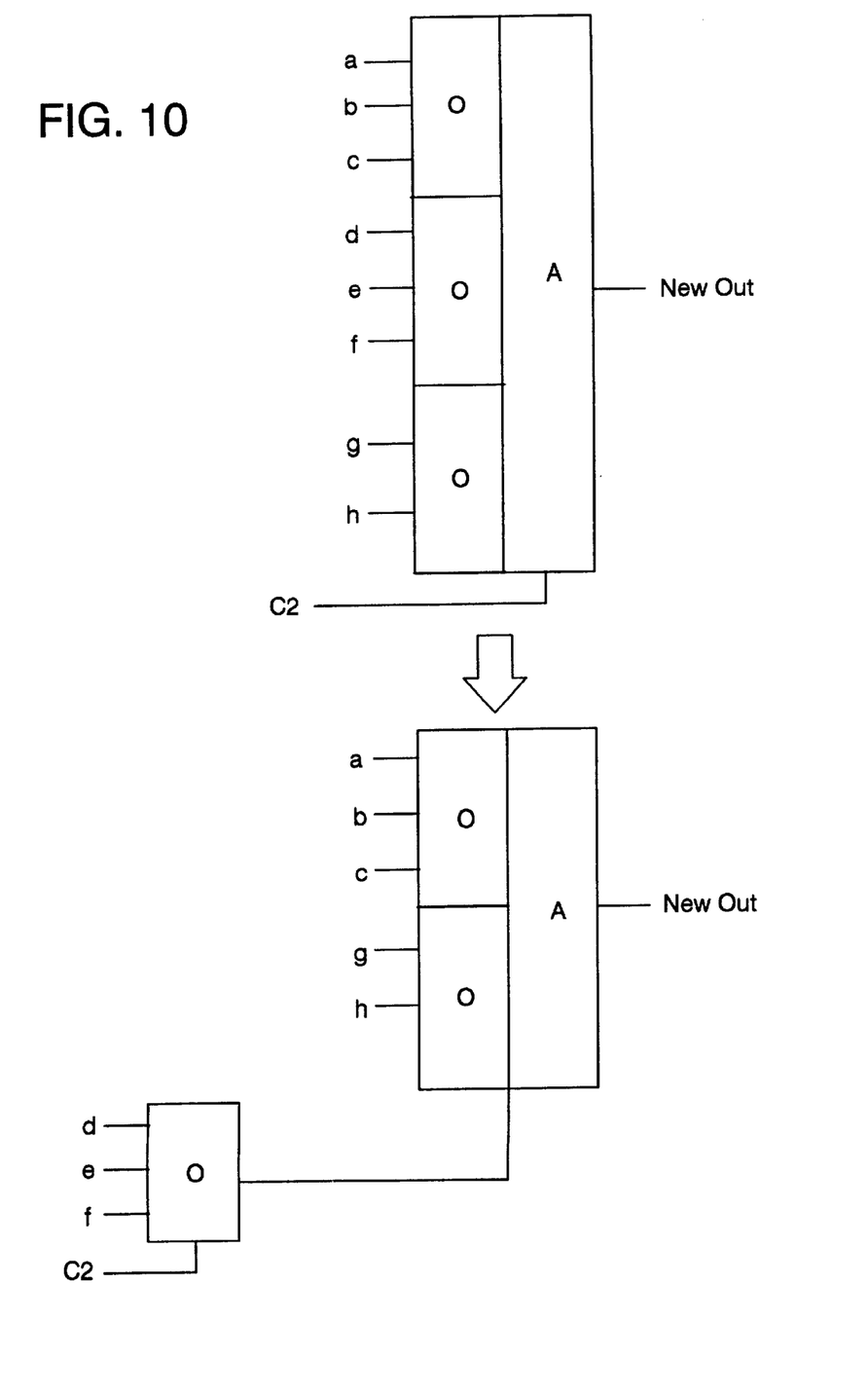

Referring to FIG. 10, any footed OA can be made faster by moving its port to the clock input c2. This reduces a footed OA with three input ports to be a pseudo-clocked OA with two input ports, which should be approximately 20% faster.

Figure 11:
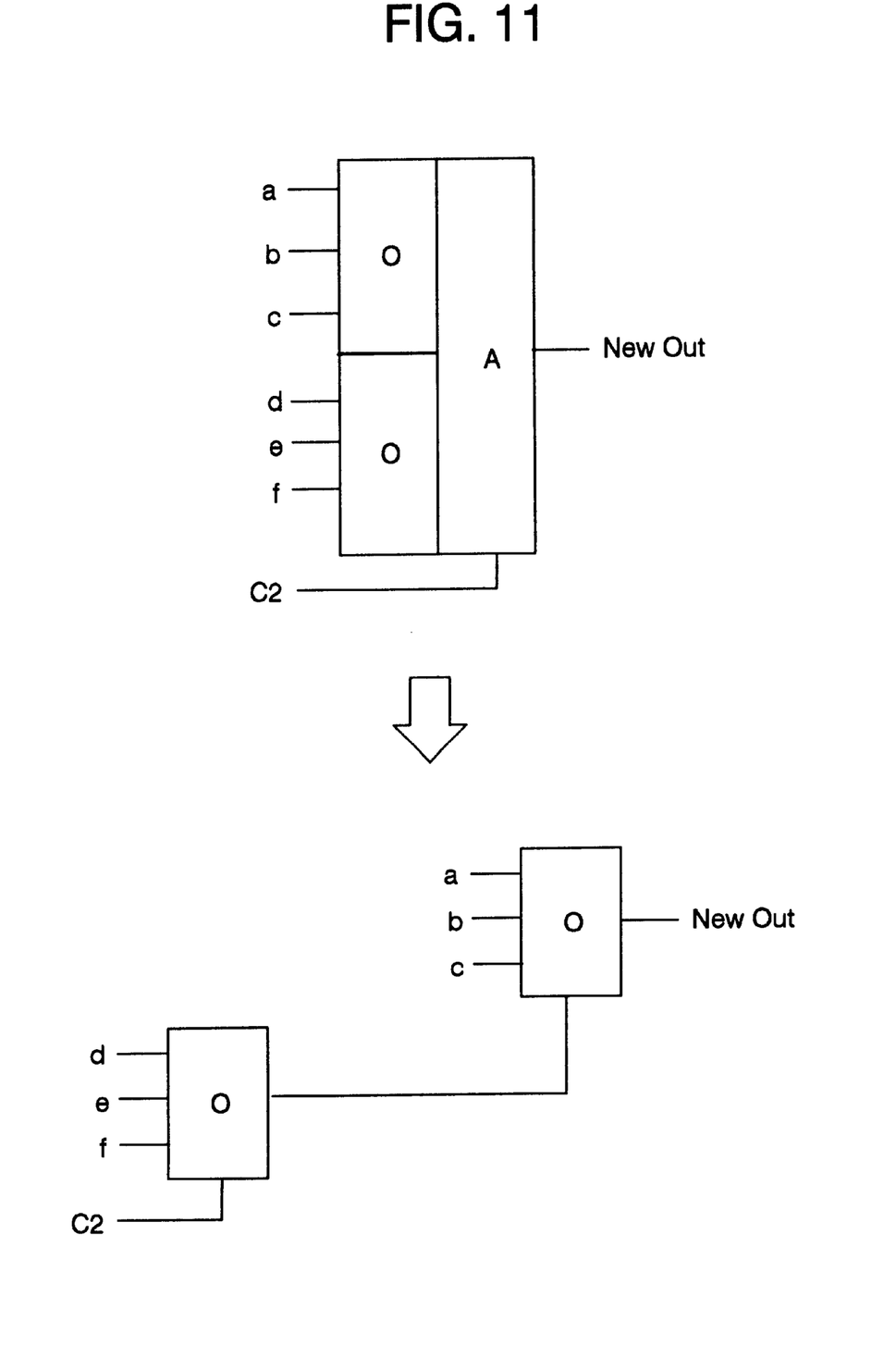

Referring next to FIG. 11, any footed OA with only two ports can be made faster by moving its port to the clock input. This converts the two-stage book into a simple single stage OR.

Figure 12:
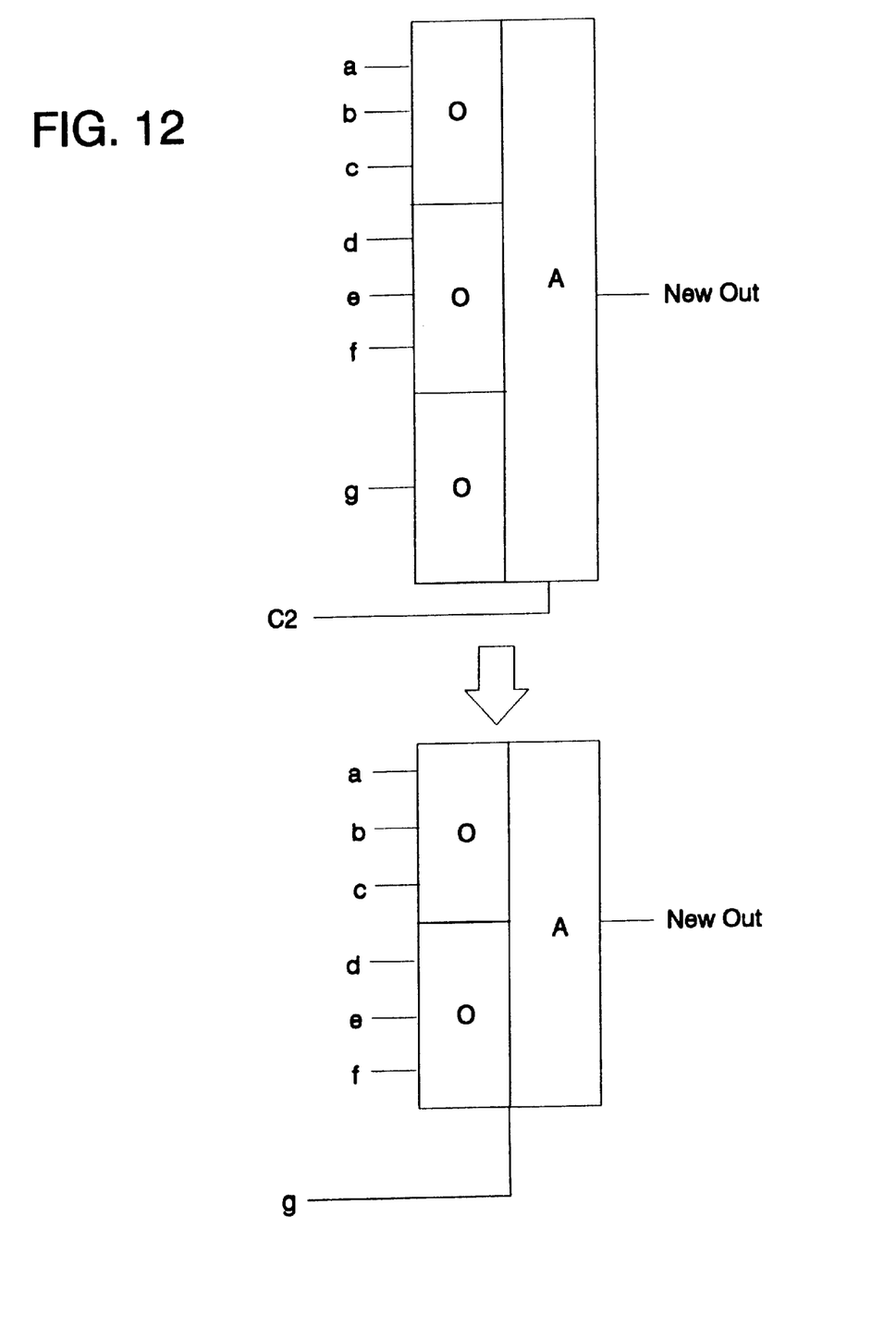

Referring next to FIG. 12, any footed OA with a single input port can be made faster by moving its port (if footed) to the clock input. This reduces a footed OA with three input ports to be a pseudo-clocked OA with two input ports, which should be approximately 20% faster.

Figure 13:
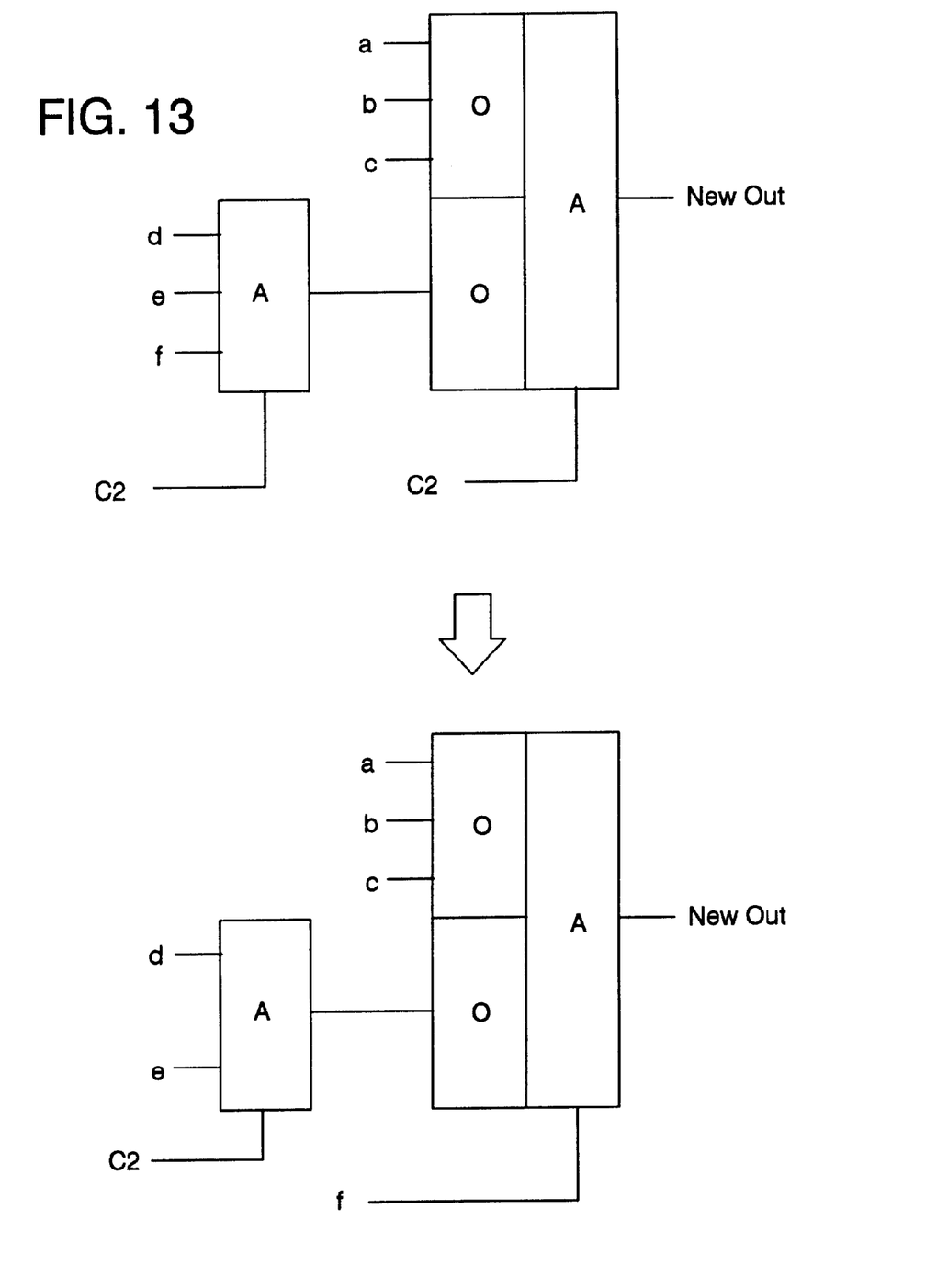

Referring next to FIG. 13, any footed OA with a single input port fed by a footed AND can be made faster by moving the latest arriving input of the AND to the clock input. This makes the AND 20% faster and improves the moved input about one block delay.

Figure 8:
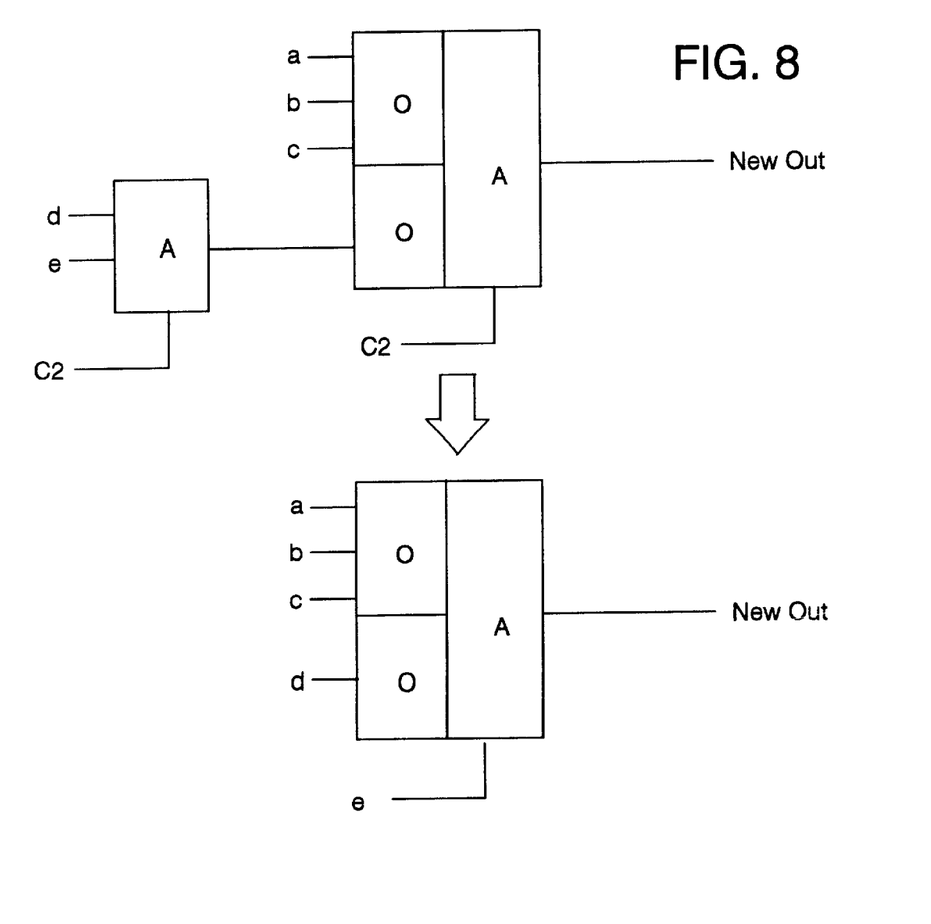

Referring next to FIG. 8, any footed OA with a single input port fed by a two-input AND can be made faster by removing the AND, placing the latest AND input as the single input port pin and the other AND input as the clock input. Either of the two original AND inputs (e) must be footed.

The following is pseudocode of an algorithm to convert the logic circuitry in accordance with the present invention as described above with respect to FIGS. 3–8 and 10–13.

Figure 9:
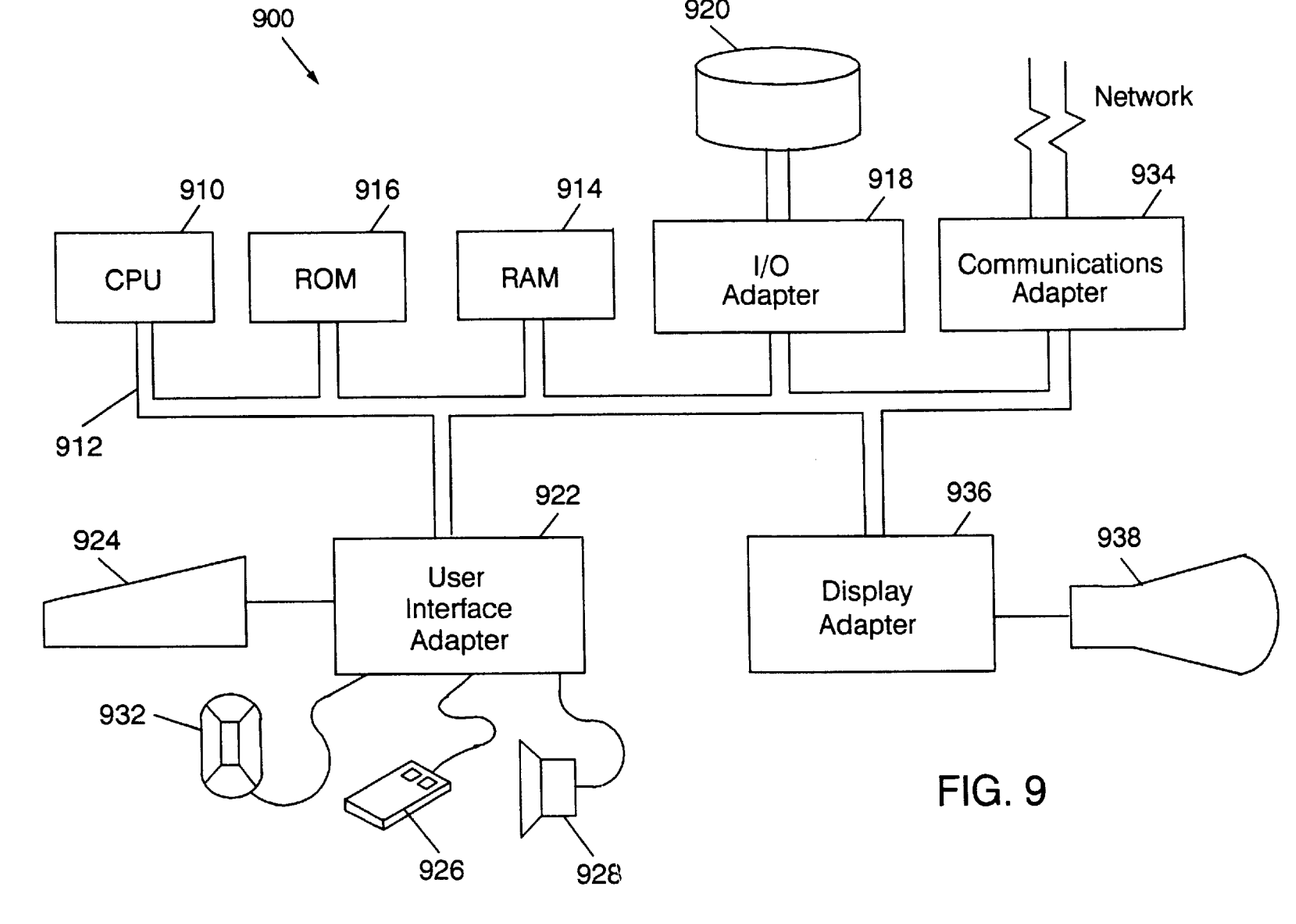
FIG. 9 illustrates an information handling system which may be used for the invention.

Referring next to FIG. 9, an example is shown of a data processing system 900, which may be used for implementing the present invention. The system has a central processing unit (CPU) 910, such as a PowerPC microprocessor ("PowerPC" is a trademark of IBM Corporation) according to "The PowerPC Architecture: A Specification for a New Family of RISC Processors," 2d edition, 1994, Cathy May, et al., Ed., which is hereby incorporated herein by reference. A more specific implementation of a PowerPC microprocessor is described in the "PowerPC 604 RISC Microprocessor Users Manual," 1994, IBM Corporation, which is hereby incorporated herein by reference. The history buffer (not shown) of the present invention is included in CPU 910. The CPU 910 is coupled to various other components by system bus 912. Read only memory ("ROM") 916 is coupled to the system bus 912 and includes a basic input/output system ("BIOS") that controls certain basic functions of the data processing system 900. Random access memory ("RAM") 914, I/O adapter 918, and communications adapter 934 are also coupled to the system bus 912. I/O adapter 918 may be a small computer system interface ("SCSI") adapter that communicates with a disk storage device 920. Communications adapter 934 interconnects bus 912 with an outside network enabling the data processing system to communicate with other such systems. Input/output devices are also connected to system bus 912 via user interface adapter 922 and display adapter 936. Keyboard 924, trackball 932, mouse 926, and speaker 928 are all interconnected to bus 912 via user interface adapter 922. Display monitor 938 is connected to system bus 912 by display adapter 936. In this manner, a user is capable of inputting to the system through the keyboard 924, trackball 932 or mouse 926 and receiving output from the system via speaker 928 and display 938. Additionally, an operating system such as AIX ("AIX" is a trademark of the IBM Corporation) is used to coordinate the functions of the various components illustrated in FIG. 9.

Preferred implementations of the invention include implementations as a computer system programmed to execute the method or methods described herein and in the Appendix, and as a computer program product. According to the computer system implementation, sets of instructions for executing the method or methods are resident in the random access memory 914 of one or more computer systems configured generally as described above. Until required by the computer system, the set of instructions may be stored as a computer program product in another computer memory, for example, in disk drive 920 (which may include a removable memory such as an optical disk or floppy disk for eventual use in the disk drive 920). Furthermore, the computer program product can also be stored at another computer and transmitted when desired to the user's work station by a network or by an external network such as the Internet. One skilled in the art would appreciate that the physical storage so that the sets of instructions physically changes the medium upon which it is stored so that the medium carries computer readable information. The change may be electrical magnetic, chemical or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Although the present invention and its advantages have been described in detail, it should be understood that various changes, substitutions and alterations can be made herein without departing from the spirit and scope of the invention as defined by the appended claims.

What is claimed is:

1. A method for redesigning a logic circuit, comprising the steps of:
    determining if the logic circuit includes a foot device coupled to a clock signal; and
    pseudo-ANDing the foot device.

2. The method as recited in claim 1, wherein the pseudo-ANDing step includes the step of coupling a data input to the foot device.

3. The method as recited in claim 2, wherein the logic circuit is a domino logic circuit having a logic tree ANDed with the foot device, wherein the foot device is an NFET.

4. The method as recited in claim 3, wherein the logic circuit comprises:
    a first domino logic device including a first plurality of data inputs and a first foot device receiving the clock signal; and
    a second domino logic device including a second plurality of data inputs, wherein the second domino logic device receives an output of the first domino logic device at one of the second plurality of data inputs, wherein the second domino logic device includes a second foot device receiving the clock signal.

5. The method as recited in claim 4, wherein a redesigned logic circuit, after the pseudo-ANDing step, comprises:
    the first domino logic device including the first plurality of data inputs; and
    a third domino logic device receiving the second plurality of data inputs, wherein the first foot device receives an output of the third domino logic device.

6. The method as recited in claim 5, wherein the second domino logic device performs an ANDing of the second plurality of data inputs and the output of the first domino logic device, and wherein the third domino logic device performs and ANDing of the second plurality of data inputs.

7. The method as recited in claim 4, wherein the second plurality of data inputs has only two data inputs, wherein a first one of the second plurality of data inputs receives the output of the first domino logic circuit, and wherein a second one of the second plurality of data inputs receives a specified data input, wherein a redesigned logic circuit, after the pseudo-ANDing step, comprises:
    the first domino logic device including the first plurality of data inputs, wherein the first foot device receives the specified data input.

8. The method as recited in claim 3, wherein the logic circuit comprises:
    a first AND device receiving three data inputs and the foot device receiving the clock signal, wherein a first one of the three data inputs arrives at the AND device before the other two data inputs,
    wherein a redesigned logic circuit, after the pseudo-ANDing step, comprises:
    a second AND device receiving the other two data inputs and the foot device receiving the first one of the three data inputs.

9. The method as recited in claim 3, wherein the logic circuit comprises:
    a first AND device receiving three data inputs and the foot device receiving the clock signal, wherein one of the three data inputs is received later by the first AND device than the other two of the three data inputs; and
    a second AND device receiving two data inputs and its foot device receiving the clock signal, wherein one of the two data inputs receives an output of the first AND device,
    wherein a redesigned logic circuit, after the pseudo-ANDing step, comprises:
    a third AND device receiving the other two of the three data inputs and the foot device receiving the clock signal, wherein the second AND device receives the two data inputs and its foot device receives the one of the three data inputs.

10. The method as recited in claim 3, wherein the logic circuit comprises:
    a first two-input AND device receiving first and second data inputs and having its foot device receiving the clock signal; and
    a second two-input AND device receiving a third data input and an output of the first AND device and having its foot device receiving the clock signal,
    wherein a redesigned logic circuit, after the pseudo-ANDing step, comprises:
    a single two-input AND device receiving the first and third data inputs and having its foot device receiving the second data input.

11. A program product device adaptable for storage on a computer readable medium, tangibly embodying a program of instructions executable by a computer to perform method steps for redesigning a logic circuit, comprising the steps of:
    determining if the logic circuit includes a foot device coupled to a clock signal; and
    pseudo-ANDing the foot device.

12. The device as recited in claim 11, wherein the pseudo-ANDing step includes the step of coupling a data input to the foot device.

13. The device as recited in claim 12, wherein the logic circuit is a domino logic circuit having a logic tree ANDed with the foot device, wherein the foot device is an NFET.

14. The device as recited in claim 13, wherein the logic circuit comprises:
    a first domino logic device including a first plurality of data inputs and a first foot device receiving the clock signal; and a second domino logic device including a second plurality of data inputs, wherein the second domino logic device receives an output of the first domino logic device at one of the second plurality of data inputs, wherein the second domino logic device includes a second foot device receiving the clock signal.

15. The device as recited in claim 14, wherein a redesigned logic circuit, after the pseudo-ANDing step, comprises:
the first domino logic device including the first plurality of data inputs; and
a third domino logic device receiving the second plurality of data inputs, wherein the first foot device receives an output of the third domino logic device.

16. The device as recited in claim 15, wherein the second domino logic device performs an ANDing of the second plurality of data inputs and the output of the first domino logic device, and wherein the third domino logic device performs and ANDing of the second plurality of data inputs.

17. The device as recited in claim 14, wherein the second plurality of data inputs has only two data inputs, wherein a first one of the second plurality of data inputs receives the output of the first domino logic circuit, and wherein a second one of the second plurality of data inputs receives a specified data input, wherein a redesigned logic circuit, after the pseudo-ANDing step, comprises:
the first domino logic device including the first plurality of data inputs, wherein the first foot device receives the specified data input.

18. The device as recited in claim 13, wherein the logic circuit comprises:
a first AND device receiving three data inputs and the foot device receiving the clock signal, wherein a first one of the three data inputs arrives at the AND device before the other two data inputs, wherein a redesigned logic circuit, after the pseudo-ANDing step, comprises:
a second AND device receiving the other two data inputs and the foot device receiving the first one of the three data inputs.

19. The device as recited in claim 13, wherein the logic circuit comprises:
a first AND device receiving three data inputs and the foot device receiving the clock signal, wherein one of the three data inputs is received later by the first AND device than the other two of the three data inputs; and
a second AND device receiving two data inputs and its foot device receiving the clock signal, wherein one of the two data inputs receives an output of the first AND device,
wherein a redesigned logic circuit, after the pseudo-ANDing step, comprises:
a third AND device receiving the other two of the three data inputs and the foot device receiving the clock signal, wherein the second AND device receives the two data inputs and its foot device receives the one of the three data inputs.

20. The device as recited in claim 13, wherein the logic circuit comprises:
a first two-input AND device receiving first and second data inputs and having its foot device receiving the clock signal; and
a second two-input AND device receiving a third data input and an output of the first AND device and having its foot device receiving the clock signal,
wherein a redesigned logic circuit, after the pseudo-ANDing step, comprises:

a single two-input AND device receiving the first and third data inputs and having its foot device receiving the second data input.

21. A system for redesigning a logic circuit, comprising:
means for determining if the logic circuit includes a foot device coupled to a clock signal; and
means for pseudo-ANDing the foot device, wherein the pseudo-ANDing means includes means for coupling a data input to the foot device, wherein the logic circuit is a domino logic circuit having a logic tree ANDed with the foot device.

22. The system as recited in claim 21, wherein the logic circuit comprises:
a first domino logic device including a first plurality of data inputs and a first foot device receiving the clock signal; and
a second domino logic device including a second plurality of data inputs, wherein the second domino logic device receives an output of the first domino logic device at one of the second plurality of data inputs, wherein the second domino logic device includes a second foot device receiving the clock signal.

23. The system as recited in claim 22, wherein a redesigned logic circuit comprises:
the first domino logic device including the first plurality of data inputs; and
a third domino logic device receiving the second plurality of data inputs, wherein the first foot device receives an output of the third domino logic device.

24. The system as recited in claim 23, wherein the second domino logic device performs an ANDing of the second plurality of data inputs and the output of the first domino logic device, and wherein the third domino logic device performs and ANDing of the second plurality of data inputs.

25. The system as recited in claim 22, wherein the second plurality of data inputs has only two data inputs, wherein a first one of the second plurality of data inputs receives the output of the first domino logic circuit, and wherein a second one of the second plurality of data inputs receives a specified data input, wherein a redesigned logic circuit comprises:
the first domino logic device including the first plurality of data inputs, wherein the first foot device receives the specified data input.

26. The system as recited in claim 21, wherein the logic circuit comprises:
a first AND device receiving three data inputs and the foot device receiving the clock signal, wherein a first one of the three data inputs arrives at the AND device before the other two data inputs,
wherein a redesigned logic circuit comprises:
a second AND device receiving the other two data inputs and the foot device receiving the first one of the three data inputs.

27. The system as recited in claim 21, wherein the logic circuit comprises:
a first AND device receiving three data inputs and the foot device receiving the clock signal, wherein one of the three data inputs is received later by the first AND device than the other two of the three data inputs; and
a second AND device receiving two data inputs and its foot device receiving the clock signal, wherein one of the two data inputs receives an output of the first AND device,
wherein a redesigned logic circuit comprises:
a third AND device receiving the other two of the three data inputs and the foot device receiving the clock signal, wherein the second AND device receives the two data inputs and its foot device receives the one of the three data inputs.

28. The system as recited in claim 21, wherein the logic circuit comprises:
   a first two-input AND device receiving first and second data inputs and having its foot device receiving the clock signal; and
   a second two-input AND device receiving a third data input and an output of the first AND device and having its foot device receiving the clock signal, wherein a redesigned logic circuit comprises:

a single two-input AND device receiving the first and third data inputs and having its foot device receiving the second data input.

* * * * *

UNITED STATES PATENT AND TRADEMARK OFFICE
CERTIFICATE OF CORRECTION

PATENT NO. : 6,339,835 B1
DATED : January 15, 2002
INVENTOR(S) : Lakshmi Narasimha Reddy and Thomas Edward Rosser

It is certified that error appears in the above-identified patent and that said Letters Patent is hereby corrected as shown below:

Column 1,
Line 12, "lie" should be -- die --.

Column 4,
Line 20, please insert the information on the attached pages.
Line 59, please delete "in the Appendix" and insert -- with respect to the pseudocode described above --.

Signed and Sealed this

Fourth Day of June, 2002

*Attest:*

*Attesting Officer*

JAMES E. ROGAN
*Director of the United States Patent and Trademark Office*